United States Patent
Weber et al.

(10) Patent No.: US 12,196,810 B2
(45) Date of Patent: Jan. 14, 2025

(54) PRODUCTION OF A QUALITY TEST SYSTEM

(71) Applicant: Siemens Aktiengesellschaft, Munich (DE)

(72) Inventors: Marc Christian Weber, Munich (DE); Manfred Baldauf, Erlangen (DE); Jonas Witt, Bamberg (DE); Frank Steinbacher, Eckental (DE); Arno Arzberger, Bayern (DE); Thomas Runkler, Munich (DE); Clemens Otte, Munich (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 347 days.

(21) Appl. No.: 17/826,624

(22) Filed: May 27, 2022

(65) Prior Publication Data
US 2022/0381832 A1 Dec. 1, 2022

(30) Foreign Application Priority Data
May 28, 2021 (EP) ..................... 21176593

(51) Int. Cl.
*G01R 31/367* (2019.01)
*G01R 31/389* (2019.01)

(52) U.S. Cl.
CPC ......... *G01R 31/367* (2019.01); *G01R 31/389* (2019.01)

(58) Field of Classification Search
CPC .. G01R 31/367; G01R 31/389; G01R 31/392; G01R 31/382; G06F 18/2414;
(Continued)

(56) References Cited

U.S. PATENT DOCUMENTS

| 4,697,134 A | * | 9/1987 | Burkum | H02J 7/00712 340/636.15 |
| 6,733,724 B1 | * | 5/2004 | Maeda | H01M 4/385 148/426 |

(Continued)

OTHER PUBLICATIONS

Liebhart, Bernhard et al: "Improved Impedance Measurements for Electric Vehicles with Reconfigurable Battery Systems"; 2021 IEEE 12TH Energy Conversion Congress & Exposition-Asia (ECCE-ASIA), IEEE; pp. 1736-1742, XP033940636.
(Continued)

*Primary Examiner* — Tung S Lau
(74) *Attorney, Agent, or Firm* — Slayden Grubert Beard PLLC

(57) ABSTRACT

Various embodiments include a method for producing a quality test system executing a quality test model with a filter mask and a quality model to determine a quality feature of a battery cell. The system has an electrochemical impedance spectroscopic unit for capturing test data relating to the battery within a frequency range. The method includes: creating the model; and producing the system. Creating the model includes: capturing spectroscopic learning data; creating the filter mask using a first machine learning method with analysis data from part of the frequency range by consulting the filter mask and creating the model using a second machine learning method. The first and the second learning method are coupled based on the learning data. The first machine learning method creates a filter mask determining the analysis data such that the second machine learning method creates a quality model optimized with respect to maximizing the quality.

13 Claims, 3 Drawing Sheets

(58) Field of Classification Search
CPC .......... Y02E 60/10; G01N 27/26; G06N 3/08; G06N 3/088; H01M 10/42
See application file for complete search history.

(56) References Cited

U.S. PATENT DOCUMENTS

| | | | | |
|---|---|---|---|---|
| 7,319,877 | B2* | 1/2008 | Krumm | G01S 5/0278 |
| | | | | 455/457 |
| 2006/0047326 | A1* | 3/2006 | Wheeler | A61N 1/36014 |
| | | | | 607/48 |
| 2007/0297675 | A1* | 12/2007 | Lee | G06F 18/2113 |
| | | | | 382/190 |
| 2008/0048622 | A1* | 2/2008 | Fee | H01M 10/44 |
| | | | | 320/141 |
| 2009/0216473 | A1* | 8/2009 | Hart | G01R 31/389 |
| | | | | 702/65 |
| 2009/0265121 | A1* | 10/2009 | Rocci | G01R 31/3835 |
| | | | | 324/426 |
| 2012/0022817 | A1* | 1/2012 | Rocci | G06F 15/00 |
| | | | | 702/63 |
| 2012/0166205 | A1* | 6/2012 | Yamaguchi | G06F 9/381 |
| | | | | 712/241 |
| 2014/0153898 | A1* | 6/2014 | Ruster | G06F 3/0634 |
| | | | | 386/231 |
| 2018/0164383 | A1* | 6/2018 | Hsieh | H01M 10/486 |

OTHER PUBLICATIONS

Hasib, Shahid A et al: "A Comprehensive Review of Available Battery Datasets, RUL Prediction Approaches, and Advanced Battery Management"; IEEE Access, IEEE, USA; vol. 9, pp. 86166-86193, XP011861635.

Hang, Yunwei et al: "Identifying degradation patterns of lithium ion batteries from impedance spectroscopy using machine learning"; Nature Communications; vol. 11, No. 1, XP055858133.

Jiao, Ruihua et al: "Remaining Useful Life Prediction of Lithium-Ion Batteries Based on Conditional Variational Autoencoders-Particle Filter"; IEEE Transactions On Instrumentation and Measurement, IEEE, USA; vol. 69, No. 11, pp. 8831-8843, XP011814172.

Wang, Fu-Kwun et al: "A Hybrid Method for Remaining Useful Life Prediction of Proton Exchange Membrane Fuel Cell Stack"; IEEE Access, IEEE, USA; vol. 9, pp. 40486-40495, XP011844220.

Kara, Ahmet et al: "A data-driven approach based on deep neural networks for lithium-ion battery prognostics"; Neural Computing and Applications, Springer London, London; vol. 33, No. 20, pp. 13525-13538, XP037599189.

* cited by examiner

PRODUCTION OF A QUALITY TEST SYSTEM

CROSS-REFERENCE TO RELATED APPLICATIONS

This application claims priority to EP Application No. 21176593.8 filed May 28, 2021, the contents of which are hereby incorporated by reference in their entirety.

TECHNICAL FIELD

The present disclosure relates to quality test systems. Various embodiments of the teachings herein may include methods for producing a quality test system and/or quality test systems.

BACKGROUND

The most efficient and scalable production of powerful battery cells, in particular lithium ion batteries, is becoming increasingly important in view of rapidly growing demand. At the same time, the industrial production process also has high defect and scrap rates and great uncertainties when estimating the actual capacity or operating service life of individual battery cells. However, predictions of these parameters and of further quality parameters, in particular from dedicated self-discharge measurements, are time-consuming, sometimes a multiple of the production time, or are associated with a high resource requirement for energy and/or space.

A more precise and much quicker method for assessing the battery cell quality may use so-called electrochemical impedance spectroscopy (EIS). This measures the response, in the form of a signal strength or pulse response, of a battery cell to dedicated current or voltage excitations over a wide frequency range, typically mHz to several kHz. A known problem in this case is the evaluation of the complex frequency response measurement which comprises up to several thousand measurement points each with a real/imaginary part of the frequency-dependent impedance value. In particular, the derivation or modeling of the quality features of the cell which are of interest from the high-dimensional raw data is also a challenge.

Hitherto, statistical data analysis and spectral analysis methods, in particular, have been used to derive features of a battery cell from the impedance spectra obtained. The approach of fitting existing analytical models, that is to say models based on physical equations, to the spectral data is common. The effects which can be described by such models are limited, however, and generally do not represent all observed characteristics in the measurement data. In addition, they are not suitable for identifying new relationships or dependencies, but rather only reveal how well the previous understanding or model can be adapted to the data.

In addition, purely data-based methods, in particular regression methods or "supervised machine learning" methods, have also been recently mentioned or used in the literature. Here, a number of battery cells are usually subjected to the impedance spectroscopy method on the basis of laboratory tests and physical measurements for determining the actual capacity or stress tests for determining the remaining service life are then carried out. This results in data sets which can be used to relate impedance spectra to the subsequently measured quality features. This makes it possible to train regression models which subsequently make it possible to predict the expected features for an unknown battery cell. However, what remains unresolved in this case is the knowledge of which characteristics of the EIS measurement decisively influence the quality. In order to determine the quality of unknown battery cells in good time, in particular during manufacture, the EIS measurement must be carried out over the entire frequency range in order to generate the input data which are needed by the regression model as an input for predicting the quality. The disadvantage of this procedure is that it takes a very long time.

SUMMARY

The teachings of the present disclosure may provide a solution for an improved analysis of the quality of battery cells. For example, some embodiments may include a method for producing a quality test system (1), wherein the quality test system (1) is designed to execute a quality test model (2), wherein the quality test model (2) has a filter mask (2a) and a quality model (2c), wherein the quality test system (1) is designed to determine at least one quality feature (3c) of at least one battery cell (4) and has at least one electrochemical impedance spectroscopic unit for capturing spectroscopic test data (3) relating to the at least one battery cell (4) within a frequency range, having the steps of: creating (S1) the quality test model (2), and producing (S2) the quality test system (1) by implementing the quality test model (2) on a computing unit of the quality test system (1), wherein the creation of the quality test model (2) has the steps of: capturing (S21) spectroscopic learning data (3) relating to the at least one battery cell (4) by means of the at least one electrochemical impedance spectroscopic unit, creating (S22) the filter mask (2a) by means of a first machine learning method, wherein the filter mask (2a) is designed to determine analysis data (3a, 3b) from the spectroscopic test data (3), wherein the determination (S24) of the analysis data (3a, 3b) comprises a selection (S24a) of at least one subrange of the frequency range of the spectroscopic test data (3) by consulting the filter mask (2a), wherein the at least one subrange covers at most 50%, in particular at most 30%, of the entire frequency range of the spectroscopic test data (2a), creating (S25) the quality model (2c) by means of a second machine learning method, wherein the quality model (2c) is designed to calculate the at least one quality feature (3c) of the at least one battery cell (4) on the basis of the analysis data (3a, 3b), wherein the first machine learning method and the second machine learning method are carried out in a manner coupled on the basis of the spectroscopic learning data (3) and coordinated such that the first machine learning method creates (S22) a filter mask (2a) which determines (S24) the analysis data (3a, 3b) such that the second machine learning method creates (S25) a quality model (2c) which is optimized with respect to maximizing a quality of the at least one quality feature (3c).

In some embodiments, the at least one quality feature (3c) comprises at least: a charge storage capacity, an operating service life, a remaining service life, and/or a self-discharge rate.

In some embodiments, the quality test system (1) is also designed to use the at least one quality feature (3) for: control, a test method, and/or maintenance of manufacturing of the at least one battery cell (4).

In some embodiments, the determination (S24) of the analysis data (3a, 3b) also comprises applying (S24b) an auto-encoder (2b), in particular a variational auto-encoder (2b).

In some embodiments, the creation (S1) of the quality test model (2) also has the step of: creating (S23) the auto-encoder (2b) by means of a third machine learning method.

In some embodiments, the first machine learning method, the second machine learning method and the third machine learning method are carried out with data, coupled on the basis of the spectroscopic learning data (3) and coordinated such that the first machine learning method creates (S22) a filter mask (2a) and the third machine learning method creates (S23) an auto-encoder (2b), wherein the filter mask (2a) and the auto-encoder (2b) determine (S24) the analysis data (3a, 3b) in such a manner that the second machine learning method creates (S25) a quality model (2c) which is optimized with respect to maximizing the quality of the at least one quality feature (3c).

In some embodiments, the analysis data (3a, 3b) are a latent representation of the spectroscopic test data (3).

In some embodiments, the analysis data (3a, 3b) have a reduced complexity in comparison with the spectroscopic test data (3).

In some embodiments, the quality model (2c) is also designed to calculate at least one second quality feature of the at least one battery cell (4) on the basis of the analysis data (3a, 3b), or wherein the quality test model (2) has at least one second quality model which is designed to calculate at least one second quality feature of the at least one battery cell (4) on the basis of the analysis data (3a, 3b).

In some embodiments, the determination (S24) of the analysis data (3a, 3b) also comprises applying: a dimension reduction method, in particular t-SNE, a transformation method, and/or a feature extraction to the spectroscopic test data (3).

In some embodiments, the determination of the analysis data (S24) also comprises: grouping, sorting, regularizing, reproducing, and/or filtering the spectroscopic test data (3).

In some embodiments, the spectroscopic learning data (3) have test data and training data.

In some embodiments, the quality model (2c) is executed by means of: a convolutional neural network (CNN), a deep neural network, a linear model, in particular a partial least squares (PLS) model, a Bayesian neural network (BNN), or a Bayesian network (BN).

In some embodiments, there is a quality test system (1) produced according to a method as described herein.

In some embodiments, a method includes: determining analysis data (3a, 3b) from the spectroscopic test data (3) by means of the filter mask (2a), wherein the determination of the analysis data (3a, 3b) comprises a selection of at least one subrange of the frequency range of the spectroscopic test data (3) by consulting the filter mask (2a), wherein the at least one subrange covers at most 50%, in particular at most 30%, of the entire frequency range of the spectroscopic test data (3), and calculating the at least one quality feature (3c) of the at least one battery cell (4) on the basis of the analysis data (3a, 3b) by means of the quality model (2c).

BRIEF DESCRIPTION OF THE DRAWINGS

The features and advantages of the teachings herein become clear from the following explanations of a plurality of exemplary embodiments on the basis of the schematic drawings, in which.

DETAILED DESCRIPTION

Figure 1:
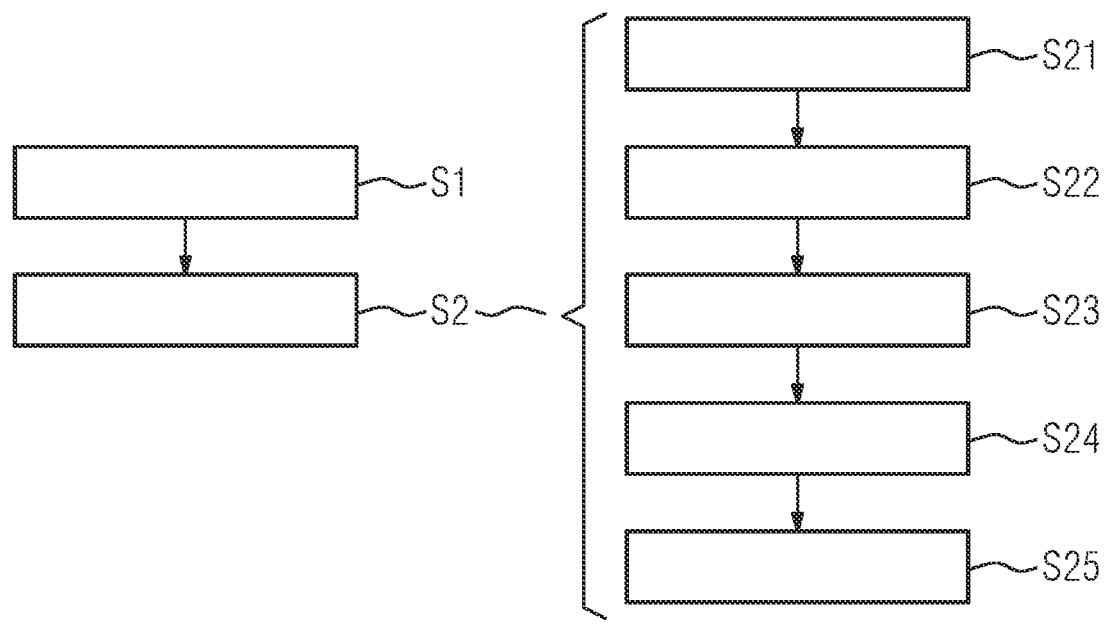
FIG. 1 shows a flowchart of a method incorporating teachings of the present disclosure.

The teachings of the present disclosure relate to methods for producing a quality test system designed to execute a quality test model, wherein the quality test model has a filter mask and a quality model. The quality test system may also be designed to determine at least one quality feature of at least one battery cell and has at least one electrochemical impedance spectroscopic unit (EIS unit) for capturing spectroscopic test data relating to the at least one battery cell within a frequency range.

In some embodiments, a method comprises the steps of:
creating the quality test model, and
producing the quality test system by implementing the quality test model on a computing unit of the quality test system.

In some embodiments, creating the quality test model also comprises:
capturing spectroscopic learning data relating to the at least one battery cell by means of the at least one electrochemical impedance spectroscopic unit,
creating the filter mask by means of a first machine learning method, wherein the filter mask is designed to determine analysis data from the spectroscopic test data, wherein the determination of the analysis data comprises a selection of at least one subrange of the frequency range of the spectroscopic test data by consulting the filter mask, wherein the at least one subrange covers at most 50%, in particular at most 30%, of the entire frequency range of the spectroscopic test data, and
creating the quality model by means of a second machine learning method, wherein the quality model is designed to calculate the at least one quality feature of the at least one battery cell on the basis of the analysis data.

In some embodiments, the first machine learning method and the second machine learning method are carried out in a manner coupled on the basis of the spectroscopic learning data and coordinated such that the first machine learning method creates a filter mask which determines the analysis data such that the second machine learning method creates a quality model which is optimized with respect to maximizing a quality of the at least one quality feature. The quality feature can also be referred to as a suitability feature.

Some embodiments include organizing the first machine learning method and the second machine learning method and coordinating them with one another such that a filter mask is created, which filter mask makes it possible to create a quality model which is optimized with respect to maximizing the quality of the at least one quality feature. The filter mask is designed to considerably restrict and/or reduce the frequency range. Filtering by means of the filter mask results in a reduced number of frequency windows. The subrange of the frequency range of the spectroscopic test data by consulting the filter mask comprises, in particular, 50% of the entire frequency range of the spectroscopic test data. In a further embodiment, the subrange of the frequency range of the spectroscopic test data by consulting the filter mask comprises, in particular, 30%, 25%, 20%, 15%, 10%, 5%, 3% or 1%. A greater reduction, and therefore a small subrange, has the advantage of a less complex analysis and therefore means that meaningful quality criteria are achieved with less effort and use of resources.

In order to achieve this, the first machine learning method and the second machine learning method may be carried out in a manner coordinated with one another, in a coupled manner, simultaneously, at the same time and/or on the basis of one another. In other words, it is also possible to state that the filter mask is created in such a manner that the best possible quality model can be created. Technically, this is achieved, inter alia, by carrying out the first machine learning method and the second machine learning method with data which respectively result from the same first spectroscopic data. This means that the filter mask is trained by means of the first machine learning method in such a manner that the first machine learning method provides a filter mask which selects the at least one subrange of the frequency range in such a manner that the second machine learning method can train the quality model such that the quality model calculates the quality features with the highest accuracy, that is to say with maximization of the quality of the quality model, on the basis of the at least one subrange.

In some embodiments, the spectroscopic data are optionally normalized and/or respectively consist of N discrete frequency data points. The various embodiments, therefore, aim to transform the complex electrochemical impedance spectroscopic spectrum (EIS spectrum) with the aid of machine learning methods, which allows the information essential to particular quality features to be identified from the EIS spectrum. The quality features obtained in this manner can be used to accelerate the method and make it more precise by means of the quality test system, in particular quality, maintenance and test methods.

The results of the proposed method can therefore be used to subsequently have to examine only a reduced number of frequency ranges for each battery cell in a targeted manner, which makes the method more efficient and more scalable for use in the manufacturing and quality assurance process. The procedure proposed here is not limited solely to EIS measurements, but may also be used for comparable measurement methods, in particular methods for measuring a frequency spectrum, for characterizing cells, or for materials testing which is carried out by means of infrared spectroscopy, or spectroscopy for contents.

In some embodiments, the at least one quality feature comprises at least one of:
  a charge storage capacity,
  an operating service life,
  a remaining service life, and/or
  a self-discharge rate.

The quality model is designed to calculate the at least one quality feature of the at least one battery cell on the basis of the analysis data. Various embodiments of the at least one quality feature have the advantage that it is possible to make various statements regarding the quality of a battery cell.

In some embodiments, the quality test system is also designed to use the at least one quality feature for:
  control,
  a test method, and/or
  maintenance
of manufacturing of the at least one battery cell.

In some embodiments, using the at least one quality feature to control the manufacturing of the at least one battery cell comprises, in particular, modifying manufacturing parameters, adapting machine parameters and/or adapting the manufacturing process. Using the at least one quality feature for a test method of the manufacturing of the at least one battery cell comprises, in particular, switching additional test cycles, subjecting test results to further analyses and/or capturing additional test parameters. In some embodiments, using the at least one quality feature for maintenance of the manufacturing of the at least one battery cell comprises, in particular, modifying manufacturing parameters, temporally interrupting the manufacturing, maintenance work, adapting machine parameters and/or adapting the future manufacturing process.

In some embodiments, the determination of the analysis data also comprises applying an auto-encoder, in particular a variational auto-encoder. The auto-encoder may also be referred to as a feature extractor and may, in particular, carry out feature extraction from the spectroscopic test and learning data. The auto-encoder is applied to the spectroscopic test and/or learning data in addition to the filter mask and therefore creates the analysis data.

In some embodiments, creation of the quality test model includes creating the auto-encoder by means of a third machine learning method.

In some embodiments, the first machine learning method, the second machine learning method and the third machine learning method are carried out with data, coupled on the basis of the spectroscopic learning data and coordinated such that the first machine learning method creates a filter mask and the third machine learning method creates an auto-encoder, wherein the filter mask and the auto-encoder determine the analysis data in such a manner that the second machine learning method creates a quality model which is optimized with respect to maximizing the quality of the at least one quality feature. Like the coordination of the creation of the filter mask and of the quality model already, the additional coordination of the creation of the auto-encoder may provide that a quality model is thus created, which quality model calculates the quality features with the highest accuracy, that is to say with maximization of the quality of the quality model, on the basis of the at least one subrange and the analysis data.

In some embodiments, the analysis data are a latent representation of the spectroscopic test data, in particular as a result of the modification by the auto-encoder. The latent representation may also be referred to as a compressed representation or a representation comprising a reduced number of dimensions. The auto-encoder therefore may reduce the complexity of the spectroscopic test and/or learning data.

In some embodiments, the analysis data have a reduced complexity in comparison with the spectroscopic test data. This may provide data of a reduced complexity are made available to the quality model and a feature extraction has already taken place, in particular.

In summary, a (variational) auto-encoder is trained on the basis of the masked input spectrum to generate a reduced-complexity latent representation of the masked input spectra (=output of the encoder). The auto-encoder can cluster, sort, reproduce, extract features and/or filter the masked input spectrum. This can also be referred to as regularization.

In some embodiments, the quality model is also designed to calculate at least one second quality feature of the at least one battery cell on the basis of the analysis data. This may provide that various further processing steps can be introduced, in particular on the basis of a magnitude of the uncertainty of the particular quality feature, in particular a complete re-measurement of the EIS spectrum for the battery cell under consideration or direct sorting can be initiated.

In some embodiments, the quality test model has at least one second quality model which is designed to calculate at least one second quality feature of the at least one battery cell on the basis of the analysis data. In this configuration, a plurality of quality models could be trained, in particular with an increasing number of frequencies, in particular by weakening the L1 regularization during training. In some embodiments, the quality models would be executed as a chain, in particular: a subsequent quality model is evaluated only if the predicted uncertainty of the preceding quality model is too high. This may provide a time saving by avoiding frequency measurements which are not absolutely necessary. In some embodiments, different frequency masks and quality models may be trained for different types of battery cells.

In some embodiments, the determination of the analysis data also comprises applying:
- a dimension reduction method, in particular t-SNE,
- a transformation method, and/or
- a feature extraction to the spectroscopic test data.

This may allow various methods to be used to form the auto-encoder or as an alternative to the auto-encoder.

In some embodiments, determination of the analysis data also comprises:
- grouping,
- sorting,
- regularizing,
- reproducing, and/or
- filtering the spectroscopic test data.

This may allow reducing the complexity of the spectroscopic test and/or learning data, possibly a reduction during supply, and of thus reducing the outlay for the quality model.

In some embodiments, the spectroscopic learning data have test data and training data. This may provide that the machine learning methods can be both trained and tested.

In some embodiments, the quality model is executed by means of:
- a convolutional neural network (CNN),
- a deep neural network,
- a linear model, in particular a partial least squares (PLS) model,
- a Bayesian neural network (BNN), or
- a Bayesian network (BN).

In addition to the mean values of the quality features, a Bayesian neural network (BNN) can also generate statements relating to the expected uncertainty of the prediction.

Some embodiments comprise a quality test system produced according to a method according to teachings herein.

In some embodiments, a method includes:
- determining analysis data from the spectroscopic test data by means of the filter mask, wherein the determination of the analysis data comprises a selection of at least one subrange of the frequency range of the spectroscopic test data by consulting the filter mask, wherein the at least one subrange covers at most 50%, in particular at most 30%, of the entire frequency range of the spectroscopic test data, and
- calculating the at least one quality feature of the at least one battery cell on the basis of the analysis data by means of the quality model.

According to previous prior art, EIS measurements are carried out over the entire frequency range, which takes a long time, in particular if the low frequencies are concomitantly measured. In contrast, the methods described herein make it possible to save time if only the frequencies characteristic of the quality of the cells have to be measured. Lengthy measurements would not be practical for the large number of cells to be characterized.

Furthermore, the methods described herein may make it possible not only to assess the end-of-line quality of the cells but also to determine statements relating to the expected service life during operation of the battery. The prerequisite for this is that impedance spectra are recorded in laboratory stress tests on a small number of cells at certain intervals of time during aging tests.

In some embodiments, the EIS measurement can replace the lengthy determination of the self-discharge of the cells during manufacturing. For this purpose, in addition to determining the self-discharge, the complete EIS spectrum is also recorded for a training period, with the result that it can be used to train the methods described above. During subsequent production, it is then possible to dispense with the self-discharge measurement and instead to perform only the EIS measurement which has been temporally optimized up to then. This results in a considerable time saving when producing the cells.

FIG. 1 shows a flowchart of an example method incorporating teachings of the present disclosure for producing a quality test system 1 (illustrated in FIGS. 2 and/or 3), wherein the quality test system 1 is designed to execute a quality test model 2 (illustrated in FIGS. 2 and/or 3), wherein the quality test model 2 has a filter mask 2a (illustrated in FIGS. 2 and/or 3) and a quality model 2c (illustrated in FIGS. 2 and/or 3), wherein the quality test system 1 is designed to determine at least one quality feature 3c (illustrated in FIGS. 2 and/or 3) of at least one battery cell 4 (illustrated in FIGS. 2 and/or 3) and has at least one electrochemical impedance spectroscopic unit for capturing spectroscopic test data 3 (illustrated in FIGS. 2 and/or 3) relating to the at least one battery cell 4 within a frequency range.

In some embodiments, the method comprises:
- step S1: creating the quality test model 2, and
- step S2: producing the quality test system 1 by implementing the quality test model 2 on a computing unit of the quality test system 1, wherein the creation of the quality test model 2 has the following steps:
- step S21: capturing spectroscopic learning data 3 (illustrated in FIGS. 2 and/or 3) relating to the at least one battery cell 4 by means of the at least one electrochemical impedance spectroscopic unit,
- step S22: creating the filter mask 2a by means of a first machine learning method, wherein the filter mask 2a is designed to determine (see step S24) analysis data 3a (illustrated in FIGS. 2 and/or 3), 3b (illustrated in FIGS. 2 and/or 3) from the spectroscopic test data 3,
- step S24: wherein the determination of the analysis data 3a, 3b comprises a selection (step S24a, not illustrated) of at least one subrange of the frequency range of the spectroscopic test data 3 by consulting the filter mask 2a, wherein the at least one subrange covers at most 50%, in particular at most 30%, of the entire frequency range of the spectroscopic test data 2a,
- step S25: creating the quality model 2c by means of a second machine learning method, wherein the quality model 2c is designed to calculate the at least one quality feature 3c of the at least one battery cell 4 on the basis of the analysis data 3a, 3b, wherein the first machine learning method and the second machine learning method are carried out in a manner coupled on the basis of the spectroscopic learning data 3 and coordinated such that the first machine learning method creates a filter mask 2a (see step S22) which determines the analysis data 3a, 3b (see step S24) such that the second machine learning method creates a quality model 2c (see step S25) which is optimized with respect to maximizing a quality of the at least one quality feature 3c.

Figure 2:
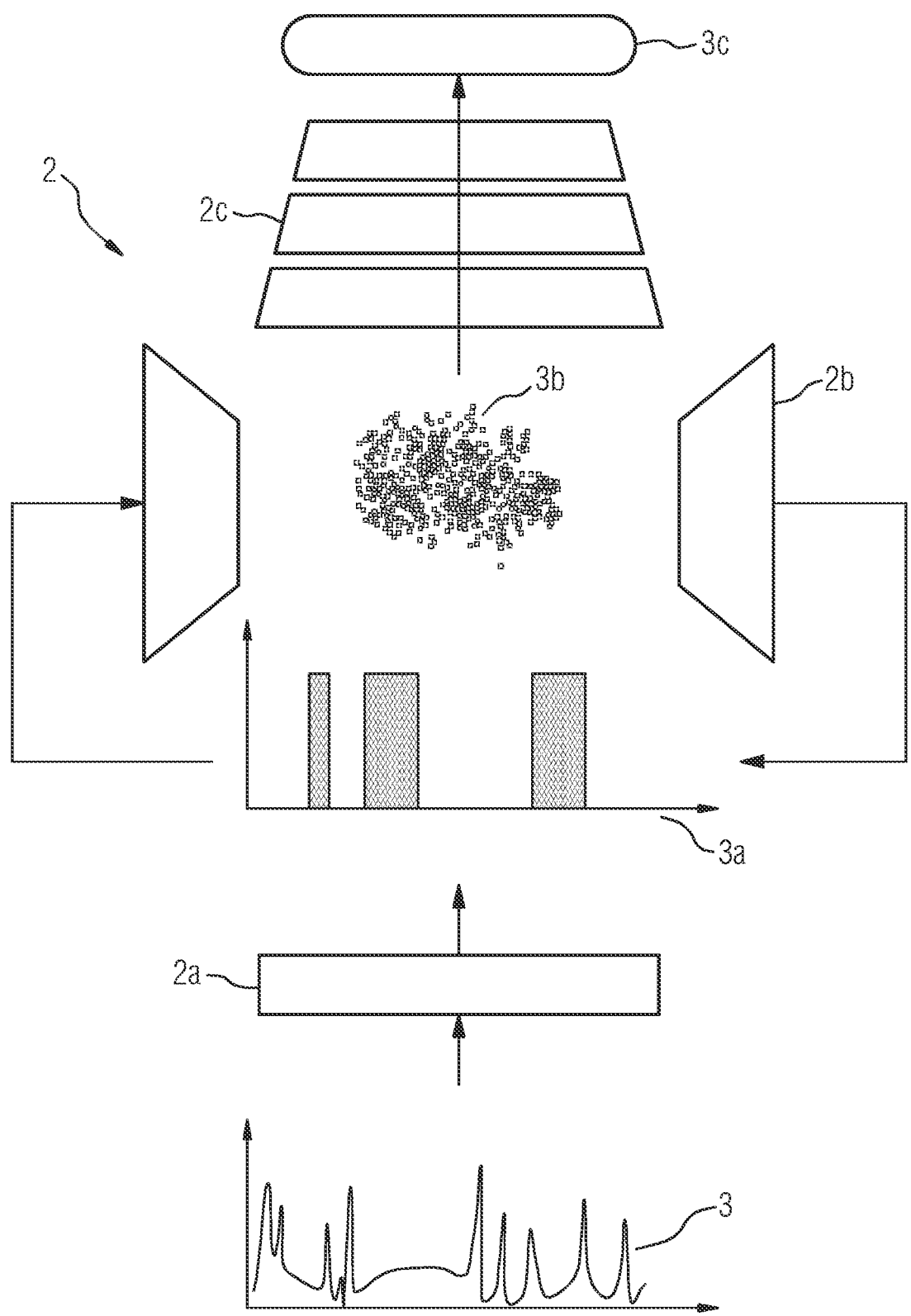
FIG. 2 shows a schematic illustration and a sequence of creating the quality test model incorporating teachings of the present disclosure.

In some embodiments, the determination (see step S24) of the analysis data 3a, 3b also comprises applying (S24b, not illustrated) an auto-encoder 2b, in particular a variational auto-encoder 2b (illustrated in FIGS. 2 and/or 3). The creation (see step S1) of the quality test model 2 therefore may include step S23: creating the auto-encoder 2b by means of a third machine learning method.

The first machine learning method, the second machine learning method and the third machine learning method are therefore carried out with data, coupled on the basis of the spectroscopic learning data 3 and coordinated such that the first machine learning method creates a filter mask 2a (see step S22) and the third machine learning method creates an auto-encoder 2b (see step S23), wherein the filter mask 2a and the auto-encoder 2b determine the analysis data 3a, 3b (see step S24) in such a manner that the second machine learning method creates a quality model 2c (see step S25) which is optimized with respect to maximizing the quality of the at least one quality feature 3c.

FIG. 2 shows a schematic illustration and a sequence of the creation (see step S1, FIG. 1) of the quality test model 2. Input values 3 are unprocessed (possibly normalized) EIS spectra 3 (each consisting of N discrete frequency data points) from a training data set of various battery cells 4.

The idea described here provides for the information contained in the EIS raw data 3 to be transformed with respect to the target features 3c (service life, capacity, etc.) by means of a combined "supervised learning" and "unsupervised learning" method, for example using a "variational auto-encoder" (VAE) 2b or a dimension reduction method 2b (for example t-SNE 2b), in such a manner that a restriction 2a to the relevant frequency ranges 3a (or combinations of ranges) can be derived therefrom, which restriction is needed in future to optimally assess the quality or suitability of unknown battery cells 4. The measurement of frequency ranges which are therefore irrelevant can therefore be dispensed with in order to save time and resources during (mass) manufacturing.

A trainable vector layer 2a, which can also be referred to as an "attention layer" 2a or frequency mask 2a, of likewise N weights in the range of values [0, 1] then initially transforms the input spectrum 3 into a reduced number of frequencies 3a (masked input spectrum 3a). The training of these weights 2a is coupled to the subsequent optimization of the quality model 2c and of the auto-encoder 2b. That is to say, the training of the attention layer 2a is optimized and coordinated so as to filter out the ranges with which the quality model 2c provides the best results. The attention layer 2a and the quality model 2c are therefore trained simultaneously. Those frequency ranges which are particularly relevant to adapting the subsequent learning objectives 3c (of the quality model 2c and of the auto-encoder 2b) are therefore preferably selected.

A (variational) auto-encoder 2b is trained on the basis of the masked input spectrum 3a to generate a reduced-complexity, latent representation of the masked input spectra 3a (=output 3b of the encoder 2b). The auto-encoder 2b can cluster, sort, reproduce, extract features and/or filter the masked input spectrum 2a. This can also be referred to as regularization 2b.

The output 3b of the auto-encoder 2b, that is to say the latent representation 3b of the raw data spectrum 3, is simultaneously used as an input for training a "supervised" deep "quality model" 2c (for example consisting of a "convolutional neural network" (CNN) 2c or an uncertainty-containing Bayesian network (BNN) 2c), during which a prediction of the quality features 3c of the cells 4 is learnt (target variables 3c for this learning step come from measurements which are carried out on the battery cells 4 following the EIS spectra 3).

In the event of successfully completed training, the reduced representation 3b of the raw spectra 3 in the masked frequency domain 3a (output of the attention layer 2a) contains only those frequency ranges which are necessary and relevant to predicting (by means of the quality model 2c) or reproducing (by means of the auto-encoder 2b) the quality criteria 3c.

Sensor noise is also implicitly corrected or suppressed in the impedance spectroscopic measurement 3. This can be carried out, in particular, by means of suitable coding in the latent representation 3b, that is to say it is learnt to map noisy sensor values 3 to the same latent representation 3b as the non-noisy values 3b and to therefore reconstruct the latter from the noisy measurements 3.

Figure 3:
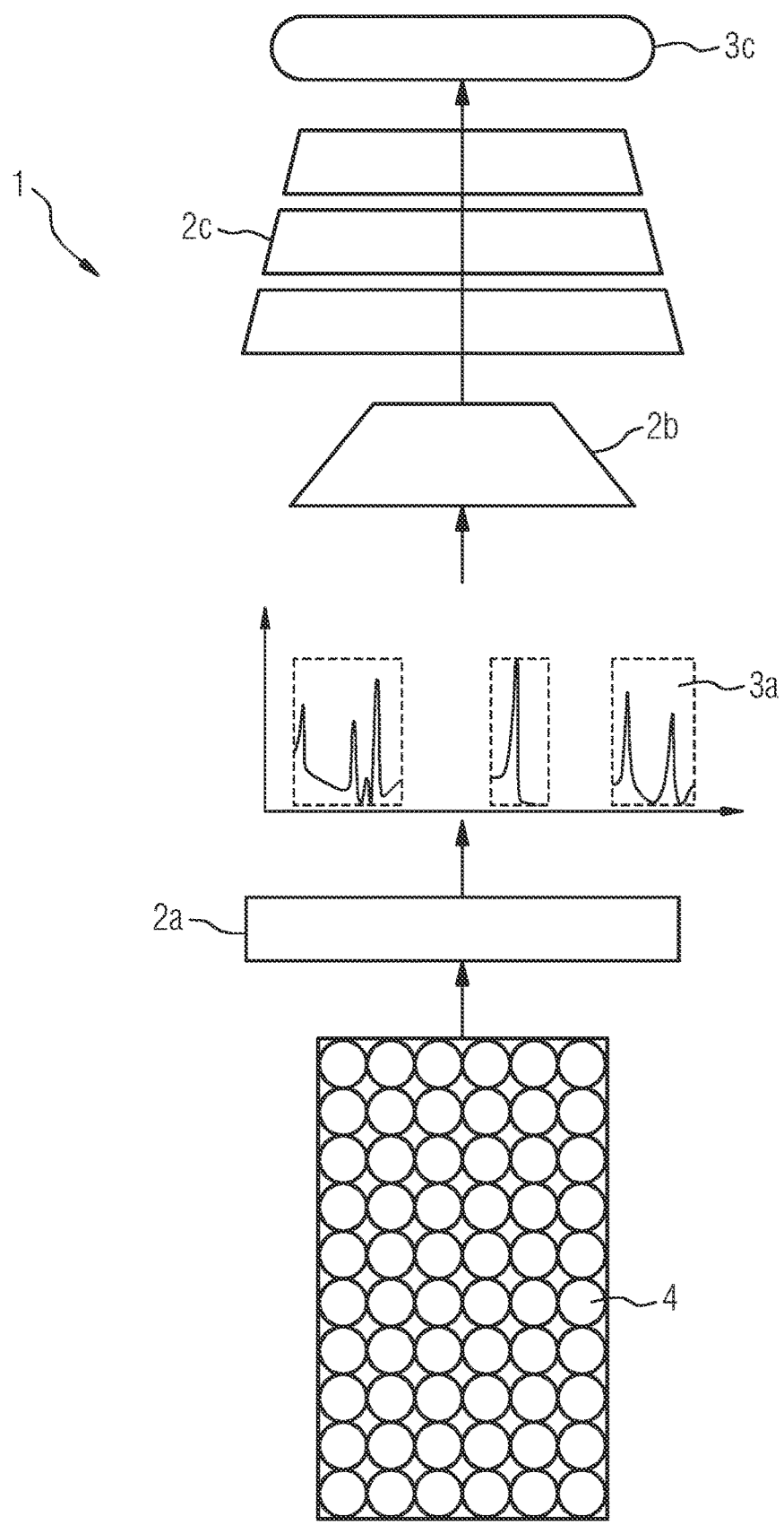
FIG. 3 shows a schematic illustration and a sequence of using the quality test system incorporating teachings of the present disclosure.

FIG. 3 shows a schematic illustration and a sequence of a use of the quality test system 1. When producing battery cells 4, the trained quality models 2c can be used as follows in order to increase efficiency:

The battery cells 4 in a batch are subjected to an EIS scan only in the selected frequency ranges; the frequency mask 2a required for this purpose is taken from the one-off training of the model (see description of FIG. 2).

The results of the restricted EIS spectra of the cells 4 are used as an input for the (CNN/deep) quality model 2c pre-trained for these frequency ranges in order to respectively predict the expected quality 3c.

On the basis of the predictions of the quality model 2c, individual cells 4 can be sorted out or, in the case of a corresponding lack of clarity of the quality models 2c, can be subjected to complete retesting.

Although the teachings herein has been described and illustrated more specifically in detail by means of the exemplary embodiments, the scope of the disclosure is not restricted by the disclosed examples and other variations can be derived therefrom by a person skilled in the art without departing from the scope of protection.

The invention claimed is:

1. A method for producing a quality test system executing a quality test model with a filter mask and a quality model, wherein the quality test system determines a quality feature of a battery cell and has an electrochemical impedance spectroscopic unit for capturing spectroscopic test data relating to the battery cell within a frequency range, the method comprising:
  creating the quality test model;
  producing the quality test system by implementing the quality test model on a computing unit of the quality test system;
  operating the quality test system on a plurality of battery cells to determine respective quality features for each battery cell of the plurality of battery cells;
  generating a sorted ranking for the plurality of battery cells based on the respective quality features and identifying individual battery cells for use; and
  automatically generating a control signal operating a mechanism to scrap any individual battery cells having a respective quality feature below a usable threshold;
  wherein creation of the quality test model includes:
    capturing spectroscopic learning data related to the battery cell using the electrochemical impedance spectroscopic unit;

creating the filter mask using a first machine learning method, wherein the filter mask determines analysis data from the spectroscopic test data, wherein determination of the analysis data comprises selecting a subrange of the frequency range of the spectroscopic test data by consulting the filter mask, wherein the subrange covers at most 50% of the entire frequency range of the spectroscopic test data; and creating the quality model using a second machine learning method, wherein the quality model calculates the quality feature of the battery cell based on the analysis data;

wherein the first machine learning method and the second machine learning method are carried out in a manner coupled on the basis of the spectroscopic learning data and coordinated such that the first machine learning method creates a filter mask determining the analysis data such that the second machine learning method creates a quality model optimized with respect to maximizing a quality of the quality feature.

2. The method as claimed in claim 1, wherein the quality feature comprises a parameter selected from the group consisting of: a charge storage capacity, an operating service life, a remaining service life, and a self-discharge rate.

3. The method as claimed in claim 1, wherein the quality test system uses the quality feature for at least one of: control, a test method, and/or maintenance or manufacturing of the battery cell.

4. The method as claimed in claim 1, wherein determination of the analysis data also comprises applying an auto-encoder.

5. The method as claimed in claim 4, wherein creation of the quality test model includes creating the auto-encoder using a third machine learning method.

6. The method as claimed in claim 5, wherein the first machine learning method, the second machine learning method, and the third machine learning method are:
carried out with data;
coupled on the basis of the spectroscopic learning data; and
coordinated such that the first machine learning method creates a filter mask and the third machine learning method creates an auto-encoder;

wherein the filter mask and the auto-encoder determine the analysis data in such a manner that the second machine learning method creates a quality model optimized with respect to maximizing the quality of the quality feature.

7. The method as claimed in claim 1, wherein the analysis data comprise a latent representation of the spectroscopic test data.

8. The method as claimed in claim 1, wherein the analysis data have a reduced complexity in comparison with the spectroscopic test data.

9. The method as claimed in claim 1, wherein:
the quality model calculates a second quality feature of the battery cell on the basis of the analysis data; or
the quality test model has a second quality model calculating a second quality feature of the battery cell based on the analysis data.

10. The method as claimed in claim 1, wherein determination of the analysis data comprises applying at least on method selected from the group consisting of: a dimension reduction method, a transformation method, and a feature extraction to the spectroscopic test data.

11. The method as claimed in claim 1, wherein determination of the analysis data comprises at least one process selected from the group consisting of: grouping, sorting, regularizing, reproducing, and filtering the spectroscopic test data.

12. The method as claimed in claim 1, wherein the spectroscopic learning data include test data and training data.

13. The method as claimed in claim 1, wherein the quality model is executed by at least one system selected from the group consisting of: a convolutional neural network (CNN), a deep neural network, a linear model, a Bayesian neural network (BNN), or a Bayesian network (BN).

* * * * *